United States Patent
Almulla

[19]

[11] Patent Number: 6,147,539
[45] Date of Patent: *Nov. 14, 2000

[54] METHOD AND STRUCTURE FOR IMPROVING POWER CONSUMPTION ON A COMPONENT WHILE MAINTAINING HIGH OPERATING FREQUENCY

[75] Inventor: Waleed Almulla, Hillsboro, Oreg.

[73] Assignee: Intel Corporation, Santa Clara, Calif.

[ * ] Notice: Under 35 U.S.C. 154(b), the term of this patent shall be extended for 1205 days.

[21] Appl. No.: 08/693,551

[22] Filed: Aug. 7, 1996

Related U.S. Application Data

[63] Continuation of application No. 08/168,932, Dec. 16, 1993, abandoned.

[51] Int. Cl.[7] .................................................. H03L 5/00
[52] U.S. Cl. .............................. 327/333; 327/530; 326/63
[58] Field of Search ............................ 307/296.1, 296.4, 307/296.6, 475; 327/530, 545, 546, 538, 333; 326/62, 63

[56] References Cited

U.S. PATENT DOCUMENTS

| | | | |
|---|---|---|---|
| 4,689,503 | 8/1987 | Suzuki et al. | 307/475 |
| 4,713,796 | 12/1987 | Ogiue et al. | 365/189 |
| 5,047,671 | 9/1991 | Suthar et al. | 307/475 |
| 5,084,637 | 1/1992 | Gregor | 307/475 |
| 5,214,327 | 5/1993 | Saeki et al. | 307/296.1 |
| 5,245,224 | 9/1993 | Suzuki et al. | . |
| 5,317,207 | 5/1994 | Mortensen | 307/296.6 |
| 5,319,601 | 6/1994 | Kawata et al. | 307/296.6 |
| 5,347,170 | 9/1994 | Hayakawa et al. | 307/296.6 |
| 5,483,176 | 1/1996 | Rodriguez et al. | 326/21 |

OTHER PUBLICATIONS

Lowry et al, "Low Power Consumption Communication System", Communications, Computers & Signal Processing, 1991, May 1991, p. 807,810.

Lowy et al, "Ultra–Low Power Consumtion Military Communication Systems", MILCOM '91: Communications in a Changing World, Jul. 1991, p. 30–36.

Lowy et al, "Ultra–low Power Digital CMOS Circuits", VLSI Signal Processing (book) p. 31–40, 1992.

*Primary Examiner*—Terry D. Cunningham
*Attorney, Agent, or Firm*—Blakely, Sokoloff, Taylor & Zafman LLP

[57] ABSTRACT

A low power consumption component which operate at a high frequency is provided by separating out those critical signal paths which acquire a higher voltage to operate below a maximum propagation delay requirement and operating the remainder of the devices of the component at a lower power supply to minimize overall power consumption of the component.

10 Claims, 3 Drawing Sheets

METHOD AND STRUCTURE FOR IMPROVING POWER CONSUMPTION ON A COMPONENT WHILE MAINTAINING HIGH OPERATING FREQUENCY

This is a continuation of application Ser. No. 08/168,932, filed Dec. 16, 1993, now abandoned.

BACKGROUND OF THE INVENTION

1. Field of the Invention

The present invention relates to a structure and a method for designing a component which operates at a high frequency with minimum power dissipation and power consumption.

2. Art Background

Computer technology has progressed today to provide even more functionality on smaller size component. This has led to increased portability of sophisticated computing devices. However, with more electrical elements being put on smaller pieces of component real estate, the power consumed by each component has increased. Furthermore, the problem of the heat generated by the component and the need for providing a way for the heat generated to be dissipated without harming the computing device is more significant. One way to minimize the problem of power consumption and heat dissipation is to decrease the power requirements for the elements on the component. For example, computing elements today typically operate at 5 volts. However, many new components coming on the market operate at a lower 3.3 volts. This is particularly suited for transportable or portable computing devices in which a significant amount of the weight of the device is due to the power supply (e.g., the battery). By using lower voltage devices, the same battery will provide power to the device for a longer period of time. However, as the sophistication of computing devices has increased so as the need for increased operating speed. By decreasing the power consumed by individual electrical elements on a component, the transmission speeds of signals through the elements is proportionately decreased. The resultant effect is that the component operates at a lower operating frequency. For example, for a component to operate at 50 MHz, the propagation delay through a one cycle path would have to be a maximum of approximately 20 nanoseconds. Thus, some signal paths may be able to meet this requirement at 3.3 volts and 5 volts. However, some signal paths which operate around 20 nanoseconds at 5 volts will not be able to operate at the same speed at 3.3 volts power.

SUMMARY OF THE INVENTION

It is therefore an object of the present invention to provide a method for constructing low power components which operates at high frequencies.

It is an object that the present invention provides a method for designing components which operate at a high frequency and generate a minimum amount of heat and consume the minimum amount of power.

The present invention overcomes the disadvantages of the prior art by operating at 2 power supply voltages. The signal paths which require the higher voltage in order to operate below a maximum propagation delay allowed and therefore at a specified operating frequency, are separated from those that are below the maximum propagation delay requirements at the lower supply voltage. It has been found that typically in circuit designs more than 90% of the signal paths are below the maximum propagation delay signal speed requirements at the lower voltage. Thus, a substantial power savings is achieved by operating the majority of components at the lower supply voltage and only those critical paths that cannot meet the requirement at a low voltage are operated at the higher voltage. Thus, the overall operating frequency of the component is maintained at a high frequency and the power consumed and heat generated is significantly reduced.

To construct the component, analysis is done of the circuit design to determine the critical paths of the design and the signal speeds through each of the critical paths. The signal speeds are then compared to the maximum propagation delay allowed in order to meet the operating frequency of the component while operating at the lower voltage. Those critical paths that do not meet the propagation delay requirement are then separated from the majority signal paths which meet the requirement such that the layout provides lower voltage input area and a higher voltage input area. Switches are preferably placed between signal connections between low voltage operating elements and high voltage operating elements in order that signals can be transmitted between different voltage driven elements and maintain the proper logic levels. Thus, the components produced operate at a high frequency utilizing the minimum amount of power that makes it ideal for today's sophisticated portable computing devices.

BRIEF DESCRIPTION OF THE DRAWINGS

The objects, features and advantages the present invention will be apparent to one skilled in the art from the following detailed description in which.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention unnecessarily.

Figure 1:
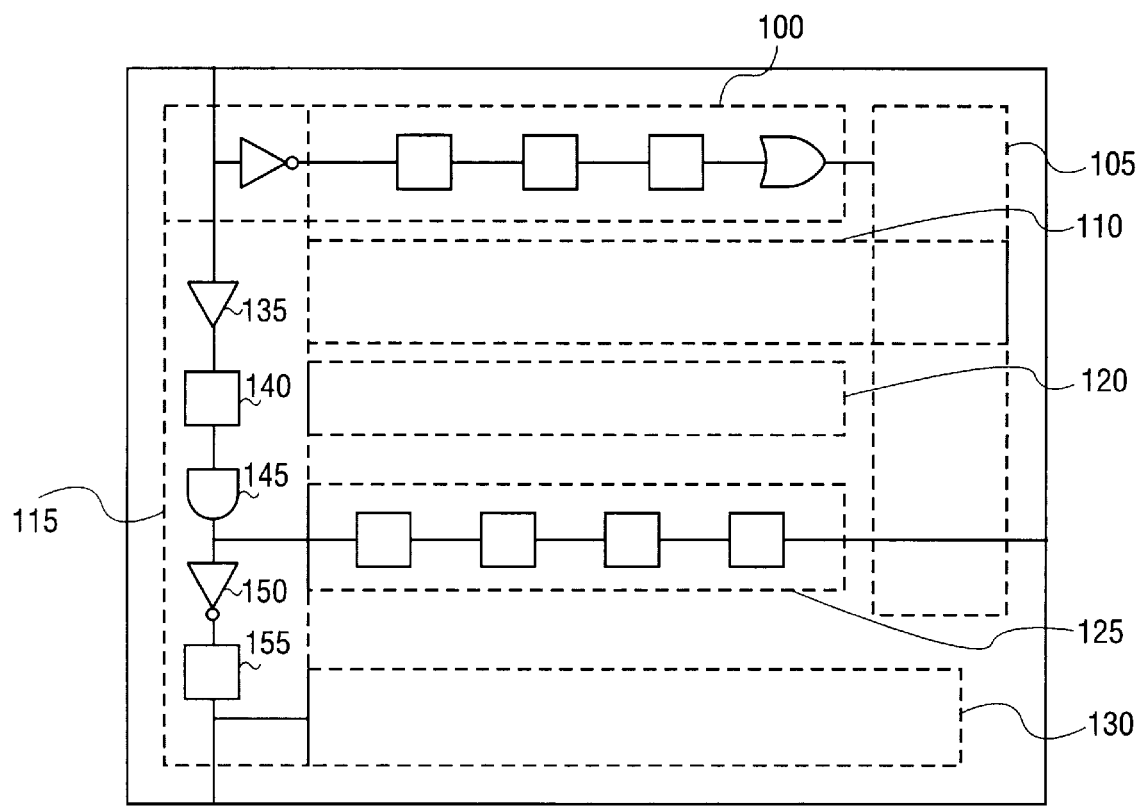
FIG. 1 is illustrative block diagram of exemplary signal path layouts in a component.

Semiconductor technology today enables a component to include upwards of $10^6$ devices on a single substrate. For example, referring to FIG. 1, a component will typically consist of many different signal paths as illustrated by the boxes 100, 105, 110, 115, 120, 125 and 130. These paths typically include a number of devices, for example, in signal path 115 devices 135, 140, 145, 150 and 155. Each of these devices consumed a determined amount of power and require a certain amount of time for the signal to propagate through the device. The more power available to the component, typically the faster the signal propagation through the devices. Therefore, high speed devices with lower propagation delays typically operate a higher supply voltages.

With concerns regarding portability of computing devices as well as heat dissipation due to packing so many devices on a single substrate, it has been desirable to maintain the high operating frequencies of the component while minimizing the power consumption and also the heat generated. Although there are many low voltage operating components available on the market today, the propagation speed through these components do not always fall below the maximum propagation delay for a signal path required for maintaining certain high operating frequency requirements.

The present invention provides that the critical paths of the components, that is, those signal paths which must operate with a propagation delay below the maximum propagation delay, in order that the component operates at the predetermined frequency, be analyzed to determine whether the signal paths meet the propagation delay requirement while operating at a lower power supply voltage. The maximum propagation delay permitted is preferably determined as the inverse value of the operating frequency. For example, for an operating frequency of 50 MHz, the maximum propagation delay allowed is 1/50=20 nanoseconds. The signal paths which do not meet the propagation delay requirement while operating at a lower supply voltage are separated from the remaining signal paths and are located on the component such that the components are powered by the higher voltage supply. Thus, those signal paths will also meet the propagation delay requirement to maintain the operating frequency of the component.

At some locations in the signal paths on the component, the signals will need to transition between the lower voltage and the higher voltage. In one embodiment, switches are used to change the signal level of a signal output by a low voltage operating device for input to a high voltage operating device. Similarly, a switch may be used to connect the signal output by a high voltage operating device for the input to a low voltage operating device. The technology to design level shifters to translate a 3.3 volt level signal to a 5 volt level signal, and a 5 volt level signal to a 3.3 volt level signal, is known in the art. Although, some time is spent in the signal path for processing the signal through the switch, the time penalty does not typically defeat the increase in signal speed by providing a hybrid path consisting of low voltage operating devices and high voltage operating devices. Alternately, many 3.3 volt devices can accept a 5 volt level signal and operate correctly to produce an accurate 3.3 volt level output signal. Therefore, the component performs the logic level shifting function, eliminating the need for a separate level switch. However, due to potential errors which may occur, it is preferred that a 3.3 volt level signal is converted by a level shifter to a 5 volt level signal prior to input to a device operating at 5 volts.

Figure 2:
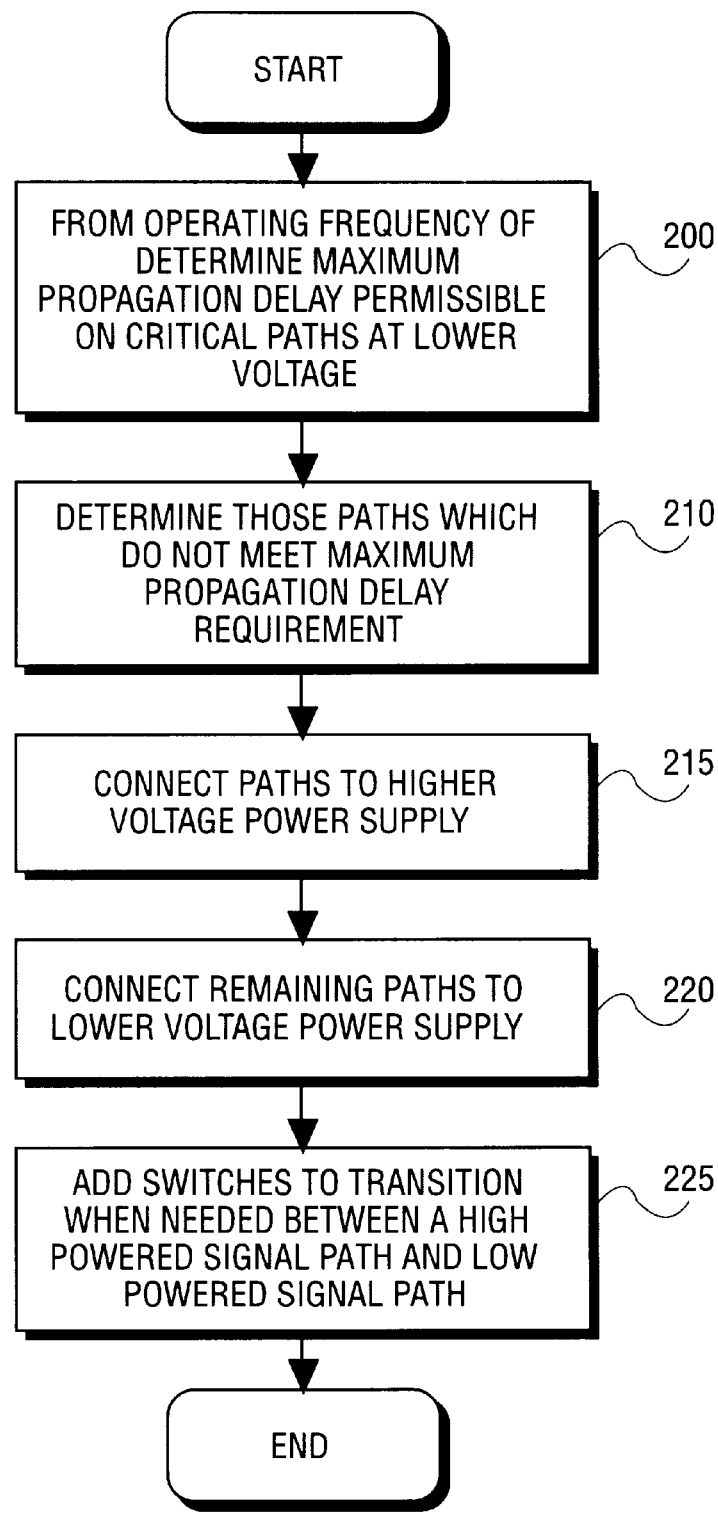
FIG. 2 is a flowchart which illustrates the process for designing a component in accordance with the teachings of the present invention.

The process for designing such a component is described in general with respect to FIG. 2. At step 200, the maximum propagation delay permissible on a critical path needed while operating at a lower voltage is determined. This is determined from the operating frequency of the component device. For example, if the component is to operate at 50 MHz, the critical paths have a minimum speed requirement of 1/50 MHz or 20 nanoseconds in order to maintain a 50 Mz operating frequency. At step 210, analysis is then done on the circuit to determine the critical paths and those critical paths that still meet the propagation delay requirement at the lower voltage. For example, signal paths that operate at the maximum propagation delay, for example, 20 nanoseconds, when the devices in the signal path are operated at the higher operating voltage, for example, 5 volts, will not meet the maximum 20 nanosecond delay requirement at the lower supply voltage, for example, 3.3 volts. However, those critical signal paths that operate, for example, with a propagation delay of 14 nanoseconds and below, meet the propagation delay requirement while operating at the lower 3.3 volts supply voltage to save power.

Typically, it has been found that 90–95% of the signal paths will meet the latter requirement and can operate at the lower supply voltage. The remaining 5–10% of the signal paths which must operate at the high supply voltage have been found not to significantly affect the substantial power consumption savings achieved.

At step 215, those critical signal paths which do not meet the propagation speed requirements are connected to operate at a higher voltage power supply, and in step 220, the remaining signal paths are connected such that the components operate at a lower voltage power supply. Preferably, steps 200, 210, 215 and 220 are performed using a circuit design and simulation software package to measure the signal timing and modify the circuit layout in accordance with the timing. An example of such a package is HSPICE, sold by Cadence Inc. Using the circuit design and simulation package, the signal paths can now be analyzed and modified for the final fabricated component. At step 225, switches are added when needed to transition the signal level between 3.3 volt driven devices and 5 volt driven devices.

Figure 3:
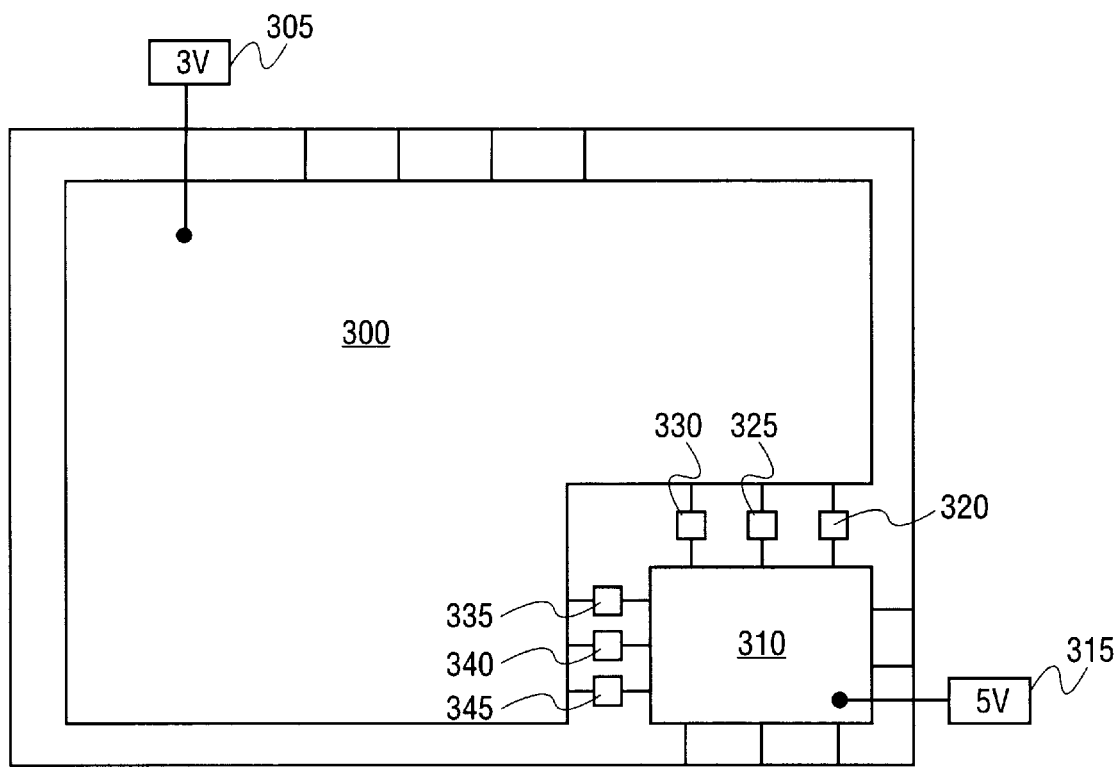
FIG. 3 is a simplified block diagram illustrating component which operate at a high frequency with minimal power consumption.

Thus, the resulting component may be designed to generate a variety of layouts including the simplified diagram shown in FIG. 3. In this case, the majority of the paths 300 operate at the lower supply voltage 305. The minority paths 310 operate at a higher voltage 315 and switches 320, 325, 330, 335, 340 and 345 are used to transmit signals between the low powered signal paths 300 and the high powered signal paths 310. FIG. 3 also shows how the lower supply voltage and the higher supply voltage may alternatively be supplied by a single voltage supply device 350.

The invention has been described in conjunction with the preferred embodiment. It is evident that numerous alternatives, modifications, variations and uses will be apparent to those skilled in the art, in light of the foregoing description.

What is claimed is:

1. An electrical component comprising a plurality of devices which are powered by a plurality of voltages, said devices arranged in signal paths, said signal paths including critical signal paths wherein during operation of the component a signal must propagate through the critical signal paths within a maximum propagation delay required to maintain the operating frequency of the component, said component operating with a minimum amount of power consumption, said component comprising:

a first portion of the component having only first voltage signal paths of devices which operate below the maximum propagation delay when the devices are operated at a first voltage said first portion operating using low power consumption;

a second portion of the component having only second voltage signal paths of devices which do not operate below the maximum propagation delay when the devices in the signal paths are operated at the first voltage, the devices of the second portion of the component operated at a second higher voltage thereby decreasing the propagation delay through the signal paths; and switches coupling certain signal paths from the first portion and second portion of the component which propagate the signal between the first voltage signal paths and higher second voltage signal paths.

2. The electrical component as set forth in claim 1, further comprising a single voltage supply device to supply the first and second voltages.

3. The electrical component as set forth in claim 1, further comprising:
   a first voltage supply device coupled to supply the first voltage; and
   a second voltage supply device coupled to supply the second higher voltage.

4. The electrical component as set forth in claim 1, wherein said switches comprise a first device coupled to the second higher voltage and a second device coupled to the first voltage, said second device receiving the high voltage signal and generating an output signal at a lower voltage level.

5. The electrical component as set forth in claim 1, wherein said switches comprise a first device coupled to the first voltage and a second device coupled to the second higher voltage, said switches to receive the low voltage level signal and shift the level of the signal to a higher voltage level signal compatible with the second device.

6. A low powered electrical system which operates at a high operating frequency comprising:
   a first voltage supply source to supply a first voltage,
   a second voltage supply source to supply a voltage higher than the voltage supplied by the first voltage supply source;
   at least one component coupled to the first voltage supply source and second voltage supply source to power the component, said component comprising:
      at least one first signal path coupled to the first voltage supply source, said first signal path having at least one first device, each first device with a propagation delay, said first signal path with a propagation delay comprising a cumulative propagation delay of the first device, said first signal path propagation delay below a maximum propagation delay permitted to operate the system at the high frequency;
      at least one second signal path coupled to the second voltage supply source, said second signal path having at least one second device, each second device with a propagation delay, said second signal path comprising a propagation delay equal to a cumulative propagation delay of the at least one second device, said second signal path propagation delay exceeding the maximum propagation delay when the second signal path is operated at the first voltage, said second signal path propagation delay below the maximum propagation delay when the second signal path is operated at the second voltage; and
      a signal level switch, coupled between the first signal path and second signal path for shifting signal levels of signals propagating between the first and second signal paths to a signal level compatible with the signal path receiving the signal.

7. The electrical system as set forth in claim 6, wherein the first voltage supply source and the second voltage supply source comprises a single voltage supply device to supply the first and second voltages.

8. The electrical system as set forth in claim wherein the first voltage supply source comprises a first voltage supply device and the second voltage supply source comprises a second voltage supply device.

9. The electrical system as set forth in claim 6, wherein said switches comprise a first device coupled to the second higher voltage and a second device coupled to the first voltage, said second device receiving the high voltage signal and generating an output signal at a lower voltage level.

10. The electrical system as set forth in claim 6, wherein said switches comprise a first device coupled to the first voltage and a second device coupled to the second higher voltage, said switches to receive the low voltage level signal and shift the level of the signal to a higher voltage level signal compatible with the second device.

* * * * *

UNITED STATES PATENT AND TRADEMARK OFFICE
CERTIFICATE OF CORRECTION

PATENT NO.    : 6,147,539 Page 1 of 1
DATED         : November 14, 2000
INVENTOR(S)   : Almulla It is certified that error appears in the above-identified patent and that said Letters Patent is hereby corrected as shown below:

Column 6,
Line 21, delete "claim wherein" and insert -- claim 6 wherein --.

Signed and Sealed this

Eighth Day of October, 2002

Attest:

Attesting Officer

JAMES E. ROGAN
*Director of the United States Patent and Trademark Office*